(12) United States Patent
Shin et al.

(10) Patent No.: US 10,983,404 B2
(45) Date of Patent: Apr. 20, 2021

(54) DISPLAY DEVICE

(71) Applicant: Samsung Display Co., Ltd., Yongin-Si (KR)

(72) Inventors: Dong Hee Shin, Asan-si (KR); Yoo Mi Ra, Ansan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/423,302

(22) Filed: May 28, 2019

(65) Prior Publication Data

US 2020/0142268 A1    May 7, 2020

(30) Foreign Application Priority Data

Nov. 6, 2018    (KR) .................. 10-2018-0135116

(51) Int. Cl.
G02F 1/1362  (2006.01)
H01L 27/12   (2006.01)
G02F 1/1339  (2006.01)
G02F 1/1345  (2006.01)

(52) U.S. Cl.
CPC ...... *G02F 1/136286* (2013.01); *G02F 1/1339* (2013.01); *G02F 1/13452* (2013.01); *H01L 27/124* (2013.01); *G02F 1/136204* (2013.01)

(58) Field of Classification Search
CPC ............. G02F 1/1339; G02F 1/136286; G02F 1/13452; H01L 27/124
USPC ......................................................... 257/72
See application file for complete search history.

(56) References Cited

U.S. PATENT DOCUMENTS

| | | | | |
|---|---|---|---|---|
| 2007/0120152 A1* | 5/2007 | Chang | ............... | G02F 1/133345 257/270 |
| 2008/0048709 A1* | 2/2008 | Lee | .................. | G09G 3/006 234/760.02 |
| 2008/0137021 A1* | 6/2008 | Choi | ................. | G02F 1/1345 349/150 |
| 2009/0296038 A1* | 12/2009 | Yoon | ................ | G02F 1/1345 349/149 |
| 2013/0270582 A1* | 10/2013 | Shin | ................... | H01L 33/48 257/88 |
| 2015/0123136 A1* | 5/2015 | Kim | ................... | H01L 27/1259 257/72 |

FOREIGN PATENT DOCUMENTS

| | | |
|---|---|---|
| KR | 10-0619411 B1 | 9/2006 |
| KR | 10-1010129 B1 | 1/2011 |
| KR | 10-1084877 B1 | 11/2011 |
| KR | 10-2017-0038338 A | 4/2017 |
| KR | 10-2018-0027692 A | 3/2018 |

* cited by examiner

*Primary Examiner* — Igwe U Anya
(74) *Attorney, Agent, or Firm* — Innovation Counsel LLP

(57) ABSTRACT

A display device according to an exemplary embodiment includes: a first substrate; first data pads that are disposed in a first row extending along a first direction on the first substrate, second data pads that are disposed in a second row extending along the first direction on the first substrate, gate pads that are disposed in the first row and are not disposed in the second row on the first substrate, data lines that are connected with the first data pads and the second data pads on the first substrate, and control signal lines that are connected the gate pads, wherein the control signal lines extend in a side area of the second data pads from the gate pads.

20 Claims, 13 Drawing Sheets

DISPLAY DEVICE

CROSS-REFERENCE TO RELATED APPLICATION

This application claims priority to and the benefit of Korean Patent Application No. 10-2018-0135116 filed in the Korean Intellectual Property Office on Nov. 6, 2018, the entire contents of which are incorporated herein by reference.

BACKGROUND

(a) Field

The present disclosure relates to a display device.

(b) Description of the Related Art

In general, a display device includes a plurality of pixels, which are units for displaying an image, and a driver. The driver includes a data driver that applies a data voltage to the pixels and a gate driver that applies a gate signal for controlling transmission of the data voltage. Conventionally, the gate driver and the data driver may be connected with a display panel by being installed in a printed circuit board (PCB) as a chip, or a driver chip may be directly installed in the display panel. However, recently, a structure for integrating a gate driver that does not require high mobility of a thin film transistor channel to a display panel rather than providing the gate driver as a chip has been researched and developed.

Demand for a display device having a small dead space that is disposed at the periphery of an image displaying area has recently increased. When the dead space is increased, the image displaying area may appear relatively small.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments of the present inventive concept have been made in an effort to provide a display device having a small dead space and of which durability and efficiency are improved.

A display device according to an exemplary embodiment includes: a first substrate; first data pads that are disposed in a first row extending along a first direction on the first substrate, second data pads that are disposed in a second row extending along the first direction on the first substrate, gate pads that are disposed in the first row and are not disposed in the second row on the first substrate, data lines that are connected with the first data pads and the second data pads on the first substrate, and control signal lines that are connected the gate pads, wherein the control signal lines extend in a side area of the second data pads from the gate pads.

The display device may further include: a second substrate, gate lines extending in the first direction, a gate driver outputting a gate signal to the gate line, and a sealant that bonds the first substrate and the second substrate to each other, wherein each of the control signal lines comprises a first portion extending in a second direction that crosses the first direction and disposed between the gate driver and an edge of the first substrate extending in the second direction, and a second portion extending in the first direction to connect one of the gate pads and the first portion, and wherein the second portion of the control signal lines does not overlap with the sealant.

The gate driver may include stages that are arranged in the second direction, and the stages may be connected with the gate lines.

The display device may further include flexible printed circuit board.

The flexible printed circuit board may include data output pads and gate output pads, the data output pads may include first data output pads disposed in a first row extending along the first direction and second output pads disposed in a second row extending along the first direction of the flexible printed circuit board in a plan view, and the gate output pads are arranged in the first row of the flexible printed circuit board and are not disposed in the second row of the flexible printed circuit board, the gate output pads being connected with the gate pads of the first substrate.

The first row of the flexible printed circuit board may be disposed closer to an edge of the flexible printed circuit board disposed adjacent to the date output pads than the second row of the flexible printed circuit board.

The second row of the flexible printed circuit board may be disposed closer to the edge of the flexible printed circuit board disposed adjacent to the date output pads than the first row of the flexible printed circuit board.

The flexible printed circuit board may include a first flexible printed circuit board and a second flexible printed circuit board that overlap each other.

The first flexible printed circuit board may include first data output pads and gate output pads, the second flexible printed circuit board may include second data output pads, the first data output pads may be connected with the first data pads, and the second data output pads may be connected with the second data pads.

The first data output pads and the gate output pads of the first flexible printed circuit board may be arranged in a line, and the gate output pads may be connected with the gate pads.

The first flexible printed circuit board may include a first data driving IC, and the second flexible printed circuit board may include a second data driving IC.

The first flexible printed circuit board may include first data output pads and the second flexible printed circuit board may include second data output pads and gate output pads, the first data output pads may be connected with the first data pads, and the second data output pads may be connected with the second data pads.

The second data output pads and the gate output pads of the second flexible printed circuit board may be disposed in a line, and the gate output pads may be connected with the gate pads.

The display device may further include a printed circuit board connected with the first flexible printed circuit board and the second flexible printed circuit board.

A display device according to an exemplary embodiment includes including a display area including a plurality of pixels and a peripheral area surrounding the display area, wherein the peripheral area includes first data pads that are disposed in a first row extending along a first direction, second data pads that are disposed in a second row extending along the first direction, gate pads that are disposed in the first row and are not disposed in the second row, and control signal lines connected with the gate pads, wherein the control signal lines extend in a side area of the second data pads from the gate pads, and wherein the display area includes gate lines extending in the first direction, data lines that are connected with the first data pads and the second data pads and cross the gate lines, and the data lines comprise a first data line and a second data line that simultaneously overlap one of the plurality of pixels.

The display device may further include a gate driver that is disposed in the peripheral area, wherein the gate driver may include a first gate driver disposed at one side of the display area and a second gate driver disposed at the other side of the display area.

The first gate driver may include a first stage, the second gate driver may include a second stage, and one of the gate lines may connect the first stage and the second stage.

Each of the gate lines may include a first sub-gate line and a second sub-gate line, which are connected in the peripheral area and transmit the same gate signal.

The control signal lines may include at least one of a clock signal line, a scan start signal line, and a low voltage line.

The display device may further include a sealant that is disposed in the peripheral area and surrounds the display area.

According to the exemplary embodiments, the display device has a small dead space, and durability and efficiency of the display device can be improved.

DETAILED DESCRIPTION OF THE EMBODIMENTS

Figure 1:
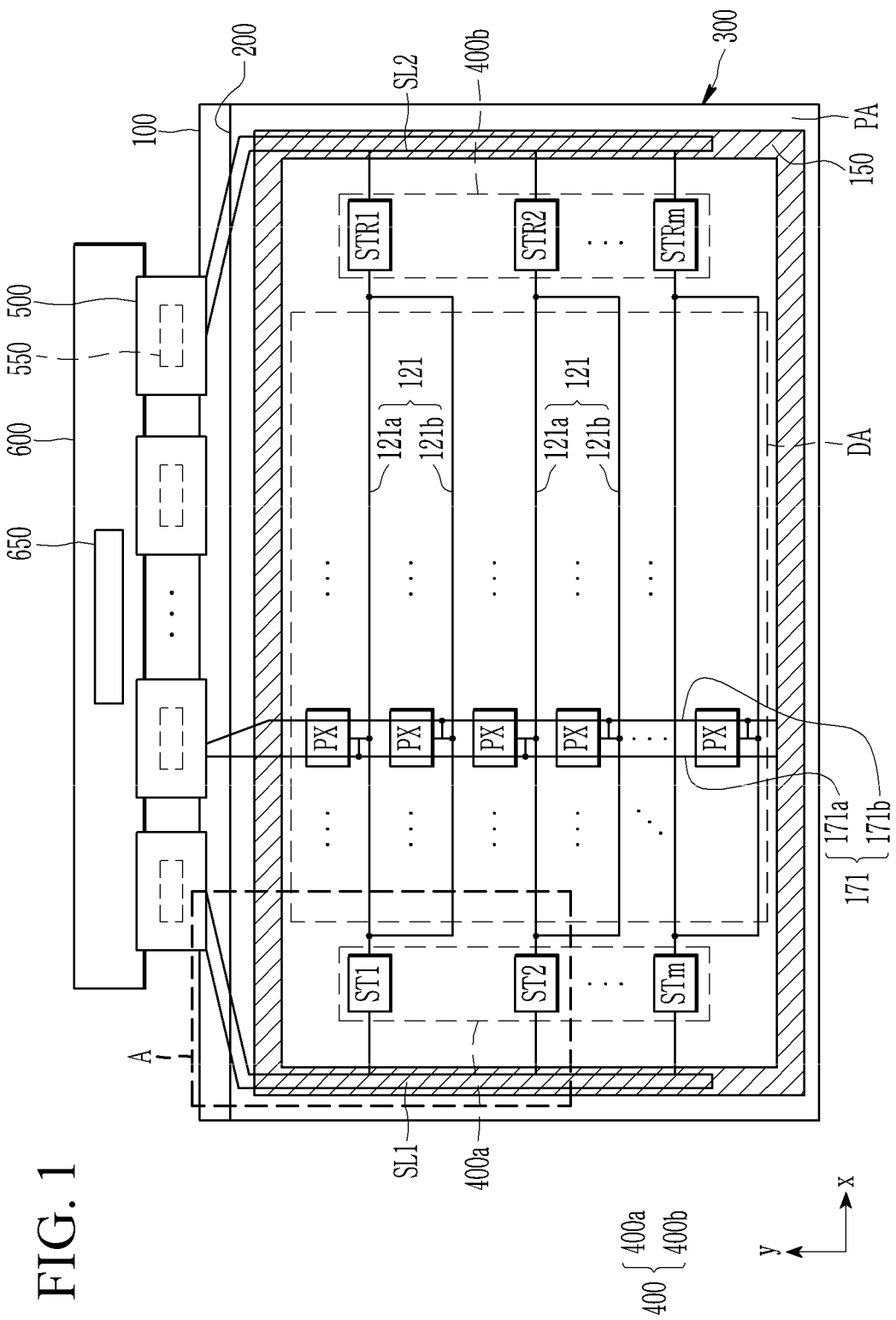
FIG. 1 is a schematic block diagram of a display device according to an exemplary embodiment of the present inventive concept.

Hereinafter, the present inventive concept will be described more fully with reference to the accompanying drawings, in which exemplary embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

Further, since a size and a thickness of each element illustrated in the drawings are arbitrarily illustrated for convenience of description, the present inventive concept is not necessarily limited to those shown in the drawings. In the drawings, the thickness of layers, films, panels, regions, etc., are exaggerated for clarity. In addition, in the drawings, for convenience of description, the thickness of some of layers, regions, etc., are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "in a plan view" means viewing a target portion from the top, and the phrase "on a cross-section" means viewing a cross-section formed by vertically cutting a target portion from the side.

Hereinafter, a display device according to an exemplary embodiment of the present inventive concept will be described with reference to FIG. 1 to FIG. 3.

FIG. 1 is a schematic block diagram of a display device according to an exemplary embodiment of the present inventive concept.

Referring to FIG. 1, a display device according to an exemplary embodiment of the present inventive concept includes a display panel 300, a flexible printed circuit board 500, and a printed circuit board 600.

The display panel 300 may be a display panel included in various display devices such as a liquid crystal display (LCD), an organic light emitting diode (OLED) display, and the like. Hereinafter, the display device according to the exemplary embodiment will be exemplarily described as a liquid crystal display.

The display panel 300 includes a display area DA where an image is displayed and a peripheral area PA that is an area other than the display area DA in the display panel 300.

In the display area DA, a plurality of gate lines 121, a plurality of data lines 171, and a plurality of pixels PX that are connected to the plurality of gate lines 121 and the plurality of data lines 171 are formed.

The gate lines 121 transmit a gate signal, and may be substantially parallel with each other while extending in a first direction (x-axis direction). A gate line 121 transmitting one gate signal may include a first sub-gate line 121a and a second sub-gate line 121b that are electrically connected with each other. Each of the first and second sub-gate lines 121a and 121b may wholly extend in the first direction (x-axis direction), and may be arranged substantially parallel with each other in a second direction (y-axis direction) in the display area DA. The first and second sub-gate lines 121a and 121b included in each gate line 121 are respectively connected to pixels PX disposed in different pixel rows, and may be electrically connected to switches of pixels PX in the respectively corresponding pixel row. The first and second sub-gate lines 121a and 121b included in each gate line 121 are respectively physically and electrically connected with each other at peripheral areas of the left and right edges of the display area DA or in the peripheral area PA, and thus may transmit the same gate signal.

The data lines 171 transmit a data voltage that corresponds to a video signal, and may be substantially parallel with each other while extending in the second direction (y-axis) that crosses the first direction. A pair of data lines 171a and 171b may be correspondingly arranged in each pixel column, and the pair of data lines 171a and 171b may include a first data line 171a and a second data line 171b. The first data line 171a and the second data line 171b may be alternately arranged in a direction that is parallel with the first direction (x-axis direction). The first data line 171a and the second data line 171b that correspond to one pixel column may overlap a pixel area of pixels PX in the corresponding pixel column while crossing the inside of the pixel area. In particular, the first data line 171a and the second data line 171b may overlap a transmission area defined by respective pixels PX of the corresponding pixel column. A first data line 171a and a second data line 171b that correspond to one pixel column may individually transmit data voltages.

First data lines 171a and second data lines 171b corresponding to one pixel column are electrically connected to switches of pixels PX that are aligned in the corresponding pixel column. In particular, in one pixel column, switches of two pixels PX respectively connected with the first and second sub-gate lines 121a and 121b are electrically connected with different data lines 171 among the first data line 171a and the second data line 171b. Thus, in one pixel column, different pixels PX connected to one gate line 121 may simultaneously receive corresponding data voltages through the first data line 171a and the second data line 171b, respectively. For example, as shown in FIG. 1, switches of pixels PX arranged in parallel with the second direction (y-axis direction) in each pixel column may be alternately electrically connected with the corresponding first and second data lines 171a and 171b.

As described, in the display panel 300 including the pixels PX that are arranged in such a matrix format, the number of gate lines 121 may be reduced to about the half the total number of pixel rows, while the number of data lines 171 may be about two times the total number of pixel columns.

The plurality of pixels PX may be arranged in an approximate matrix format. Each pixel PX may include at least one switch that is connected with a respective gate line of the gate lines 121 and the data lines 171, and at least one pixel electrode connected to the at least one switch. As an electric switch such as a thin film transistor, which is integrated with the display panel 300, the switch may include a gate terminal, an input terminal, and an output terminal. The switch is turned on or turned off according to a gate signal of the gate line 121, and may selectively transmit a data voltage from the data line 121 to the pixel electrode. The pixels PX may display a corresponding image according to the data voltage applied to the pixel electrode.

The peripheral area PA may surround the display area DA or may be disposed at edges of the display panel 300.

A sealant 150 may be disposed in the peripheral area PA. The sealant 150 may surround the display area DA in the peripheral area PA. A first substrate 100 and a second substrate 200 that faces the first substrate 100 are included in the display panel 300, and they are bonded to each other by the sealant 150 provided therebetween. The sealant 150 can prevent a liquid crystal material of a liquid crystal layer from leaking to the outside of the display panel 300 or prevent an impurity such as moisture, oxygen, and the like from permeating into the liquid crystal layer.

In the peripheral area PA, a first control signal line SL1, a second control signal line SL2, and a gate driver 400 connected to the first and second control signal lines SL1 and SL2 are disposed. In addition, the gate lines 121 and the data lines 171 of the display area DA may extend to the peripheral area PA from the display area DA.

The first control signal line SL1 includes a portion extending in the second direction (y-axis direction) at the left side of the peripheral area PA, and the second control signal line SL2 includes a portion extending in the second direction (y-axis direction) at the right side of the peripheral area PA. The first control signal line SL1 and the second control signal line SL2 may be disposed to overlap the sealant 150. However, this is not restrictive. The first control signal line SL1 and the second control signal line SL2 may be only partially overlapped with the sealant 150 or may not overlap the sealant 150. The first control signal line SL1 and the second control signal line SL2 may respectively include a plurality of clock signal lines, low voltage lines transmitting a low voltage and scan start signal lines transmitting a scan start signal.

The gate driver 400 is connected with the gate line 121 and may transmit a gate signal to the gate line 121. The gate driver 400 may be directly formed in the peripheral area PA of the display panel 300 together with an electric element such as a thin film transistor of the display area DA through the same process. The gate driver 400 may include a first gate driver 400a and a second gate driver 400b that are respectively disposed at opposite sides of the peripheral area PA with reference to the display area DA. The first gate driver 400a is connected with the first control signal line SL1 and receives a clock signal, and the second gate driver 400b is connected with the second control signal line SL2 and receives a clock signal.

The first gate driver 400a include a plurality of first stages ST1 to STm (m is a natural number) that are arranged in one column along the second direction (y-axis direction) at a left area of the display panel 300, and the second gate driver 400b includes a plurality of second stages STR1 to STRm (m is a natural number) that are arranged in one column along the second direction (y-axis direction) at a right area of the display panel 300.

Stages that respectively correspond to the first gate driver 400a and the second gate driver 400b may be connected to the same gate line 121 and thus may apply a gate signal. As described, when a gate signal is applied to the gate line 121 from both sides of the display panel 300, a failure in displaying due to a gate signal delay can be prevented even though the display panel 300 is increased in size.

The plurality of first stages ST1 to STm are connected with each other, and may generate a gate signal and sequentially transmit the gate signal to the gate line 121. The plurality of second stages STR1 to STRm are also connected with each other, and may generate a gate signal and sequentially transmit the gate signal to the gate line 121. The first stages ST1 to STm and the second stages STR1 to STRm may respectively include gate signal output terminals (not shown) that are connected to the corresponding gate lines 121 and output gate signals.

Each of the stages ST1 to STm and STR1 to STRm may be connected with an output terminal of previous stages ST1 to STm and STR1 to STRm or an output terminal of the next stages ST1 to STm and STR1 to STRm. The first stages ST1 and STR1, which do not have previous stages, can receive a scan start signal that informs the start of one frame. The last stages STm and STRm, which do not have the next stages, may receive other signals rather than being connected to an output terminal of the next stage.

Each of the stages ST1 to STm and STR1 to STRm may be connected with a low voltage that is the same as a gate-off voltage through the first control signal line SL1 and the second control signal line SL2. In addition, each of the stages ST1 to STm and STR1 to STRm may be connected with another low voltage that is lower than the gate-off voltage through the first control signal line and the second control signal line SL1 and SL2.

Each of the stages ST1 to STm and STR1 to STRm may receive a clock signal through the first and second control signal lines SL1 and SL2. The clock signal may include a first clock signal and a second clock signal of which a phase is opposite to a phase of the first clock signal, and odd-numbered stages ST1, ST3, . . . may receive the first clock signal and even-numbered stages ST2, ST4, . . . may receive the second clock signal.

Each of the stages ST1 to STm and STR1 to STRm may include an active element such as a plurality of thin film transistors or a diode integrated with the peripheral area PA of the display panel 300, and a passive element such as a capacitor and the like. The active elements and the passive elements included in the stages ST1 to STm and STR1 to STRm may be formed together with a thin film transistor included in the pixel PX of the display area DA through the same manufacturing process.

In FIG. 1, the plurality of first stages ST1 to STm are disposed at the left side of the peripheral area PA and the second stages STR1 to STRm are disposed at the right side of the peripheral area PA, but this is not restrictive. They may be disposed at any side of the peripheral area PA. In addition, depending on exemplary embodiments, one of the first gate driver 400a and the second gate driver 400b may be omitted.

The flexible printed circuit board 500 is bendable, and one side of each of the flexible printed circuit boards 500 is electrically connected with the first control signal line SL1, the second control signal line SL2, and the data lines 171 of the display panel 300 in the peripheral area PA. Specifically, the leftmost flexible printed circuit board 500 and the rightmost flexible printed circuit board 500 are electrically connected with the first control signal line SL1, the second control signal line SL2, and the data lines 171, and other flexible printed circuit boards 500 are electrically connected with the data lines 171. Each flexible printed circuit board 500 includes a data driving integrated circuit (IC) 550 that generates a data voltage, which is a grayscale voltage corresponding to an input video signal.

The printed circuit board 600 is electrically connected with the other side of each of the flexible printed circuit boards 500. The printed circuit board 600 includes a signal controller 650 that controls the data driver IC 550 and the gate driver 400. The signal controller 650 receives input video signals and an input control signal that controls the input video signals from an external graphics controller (not shown). The signal controller 650 is disposed on the printed circuit board 600, and may transmit a signal to the display panel 300 through the flexible printed circuit board 500.

Figure 2:
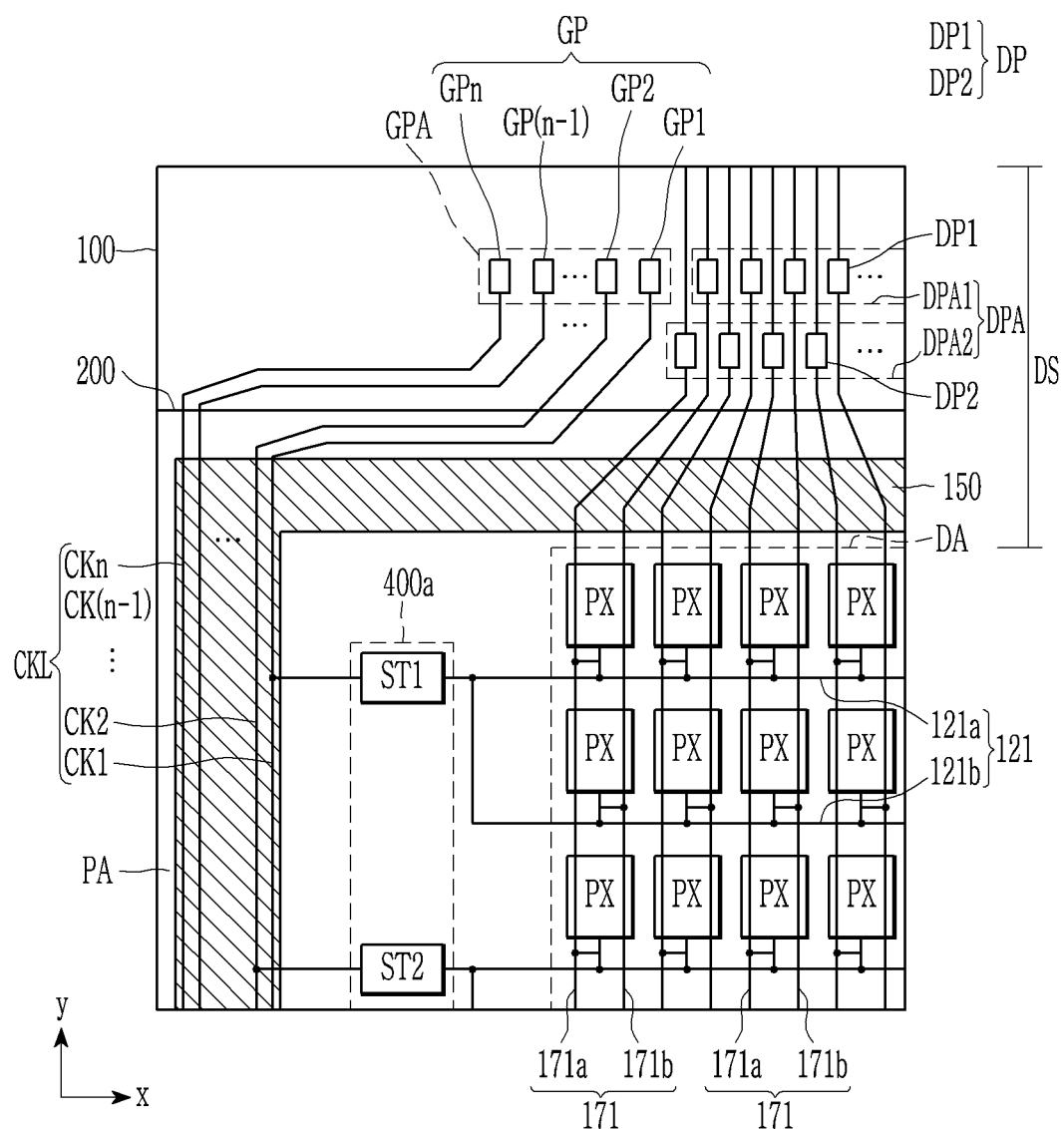
FIG. 2 is a layout view of a part A in the display device shown in FIG. 1.

FIG. 2 is a layout view of the part A in the display device shown in FIG. 1. In FIG. 2, only a clock signal group CKL of the first control signal line SL1 of FIG. 1 is illustrated.

As described above, the first substrate 100 and the second substrate 200 of the display panel 300 are bonded to each other by the sealant 150, and the display panel 300 is connected with the flexible printed circuit board 500 in an area where the first substrate 100 does not overlap the second substrate 200.

Referring to FIG. 2, a data pad portion PDA and a gate pad portion GPA that are provided for electrical connection with the flexible printed circuit board 500 are disposed in the area where the first substrate 100 does not overlap the second substrate 200.

The data pad portion DPA includes a first data pad portion DPA1 and a second data pad portion DPA2 that is disposed apart from the first data pad portion DPA1 in the second direction (y-axis direction) in a plan view. The first data pad portion DPA1 and the second data pad portion DPA2 include a plurality of data pads DP. Each data pad DP may be connected with a respective data line of the data lines 171. The data pad DP includes a plurality of first data pads DP1 that are disposed in the first data pad portion DPA1 and arranged in the first direction (x-axis direction), and a plurality of second pads DP2 that are disposed in the second data pad portion DPA2 and arranged in the first direction (x-axis direction) below the first data pads PD1 in a plan view. That is, the first data pads DP1 may be disposed in one row at the outer side of the display panel 300 and the second data pads DP2 may be disposed in one row at the inner side of the display panel 300 with reference to the first data pads DP1. The first data pad portion DPA1 may be disposed apart from the second data pad portion DPA2 in the second direction (y-axis direction). The first data pads DP1 and the second data pads DP2 may be alternately disposed with reference to the first direction (x-axis direction), but this is not restrictive.

The gate pad portion GPA includes a plurality of gate pads GP. The gate pads GP may be formed in an area where a leftmost flexible printed circuit board 500 and a rightmost flexible printed circuit board 500 are disposed. FIG. 2 exemplarily shows a gate pad GP formed in an area where the leftmost flexible printed circuit board 500 is disposed.

The number of gate pads GP may be equal to or greater than the number of clock signal lines CK1 to CKn, and each of the clock signal lines CK1 to CKn may be connected to a corresponding gate pad among the gate pads GP1 to GPn. The gate pads GP are disposed along the first direction (x-axis direction). In addition, the gate pads GP are arranged in a same row with the first data pads DP1 and are not disposed in a row in which the second data pads DP2 are arranged.

A clock signal line group CKL connected to the gate pads GP is extended in the second direction (y-axis direction) below the gate pads GP and at a side area of the second data pads DP in a plan view. Then, the clock signal line group CKL bends to the outside of the display panel 300 and then extends in the first direction (x-axis direction), while extending in the second direction (y-axis direction) at the left side of the first gate driver 400*a*. A portion of the clock signal line group CKL extended in the first direction (x-axis direction) may not overlap the sealant 150, and a portion of the clock signal line group CKL extending in the second direction (y-axis direction) at the left side of the first gate driver 400*a* may overlap the sealant 150. That is, the clock signal line group CKL includes a first portion extending in the second direction (y-axis direction) at the outer side of the first gate driver 400*a* and a second portion connected to the first portion from the gate pad GP, and the first portion of the clock signal line group CKL may overlap the sealant 150 and the second portion of the clock signal line group CKL may not overlap the sealant 150.

In case of the display device according to the present exemplary embodiment, the gate pad GP1 that is disposed at the rightmost side of the gate pad GP to the gate pad GPn that is disposed at the leftmost side of the gate pad GP may sequentially receive a first clock signal to an n-th clock signal and transmit the received clock signals to the respective clock signal lines CK1 to CKn.

When the gate pads GP are disposed in the row in which the first data pads DP1 are disposed and are not disposed in the row in which the second data pads DP2 are disposed, a space where the clock signal line group CKL can be disposed is sufficiently secured at a neighboring area of the second data pad DP2. Thus, compared to a case that the gate pads GP are formed on the left side of both the first data pad DP1 and the second data pad DP2, a length of a dead space DS may be shortened. In this case, the dead space DS may imply a vertical distance from one end of the display panel 300 which is connected with the flexible printed circuit board 500 to the display area DA.

In addition, since an area where the clock signal line group CKL can be disposed is secured, a portion of the clock signal line group CKL extending in the first direction (x-axis direction) may not overlap the sealant 150, and thus a slit may not need to be formed in the clock signal lines CK1 to CKn so that resistance in wiring can be reduced, thereby enabling fast signal transmission and preventing heat generation in the clock signal lines CK1 to CKn, thereby improving durability and efficiency of the display device.

Figure 3:
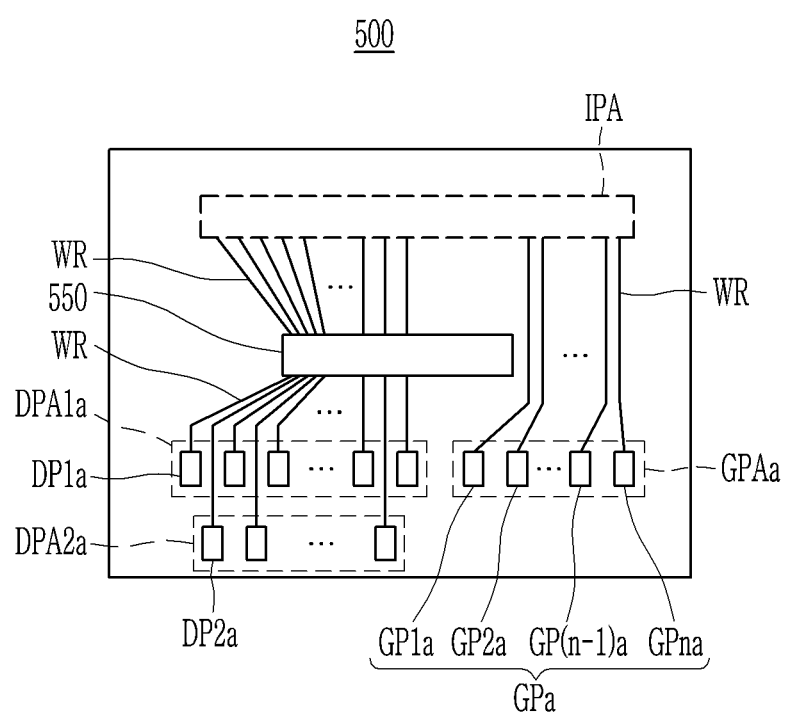
FIG. 3 is a rear side view of the flexible printed circuit board included in the display device according to the exemplary embodiment of the present inventive concept.

FIG. 3 is a rear side view of the flexible printed circuit board included in the display device according to the exemplary embodiment of the present inventive concept. The flexible printed circuit board 500 shown in FIG. 3 corresponds to the flexible printed circuit board 500 disposed at the leftmost side in FIG. 1.

The flexible printed circuit board 500 included in the display device according to the exemplary embodiment of the present inventive concept includes an input pad portion IPA, the data driving IC 550, a first data output pad portion DPA1*a*, a second data output pad portion DPA2*a*, and a gate output pad portion GPAa.

The flexible printed circuit board 500 receives a signal from the printed circuit board 600 through an input pad portion IPA that is disposed while contacting the printed circuit board 600 at one side thereof. A plurality of pads disposed in the input pad portion IPA may contact a plurality of pads disposed in the printed circuit board 600 and thus are electrically connected thereto.

The data driver IC 550 may be connected with pads of the input pad portion IPA through wires WR. The data driver IC 550 receives a data control signal and a digital video signal from the signal controller 650 through the wires WR, and generates a data voltage which is a grayscale voltage corresponding to each digital video signal. The data driver IC 550 may be connected with the first data output pads DP1*a* and the second data output pads DP2*a* through the wires WR. The data voltage generated by the data driver IC 550 is applied to the corresponding data lines 171 of the display panel 300 through the wires WR.

The first data output pad portion DPA1*a* is disposed in an area that is spaced apart from the second data output pad portion DPA2*a* in the second direction (y-axis direction) in a plan view. The first data output pad portion DPA1*a* includes a plurality of first data output pads DP1*a*, and second data output pad portion DPA2*a* includes a plurality of second data output pads DP2*a*. The first data output pads DP1*a* are disposed along the first direction (x-axis direction), and the second data output pads DP2*a* are disposed along the first direction (x-axis direction) below the first data output pads DP1*a*. The first data output pads DP1*a* are disposed apart from the second data output pads DP2*a* in the second direction (y-axis direction). That is, the second data output pads DP2*a* may be disposed in a row at an outer side of the flexible printed circuit board 500, and the first data output pads DP1*a* may be disposed in a row at an inner side of the flexible printed circuit board 500 with reference to the second data output pads DP2*a*.

The first data output pads DP1*a* and the second data output pads DP2*a* are disposed at areas corresponding to the first data pads DP1 and the second data pads DP2 of the display panel 300. Thus, the first data output pads DP1*a* and the second data output pads DP2*a* disposed at a rear side of the flexible printed circuit board 500 contact the first data pads DP1 and the second data pads DP2 of the display panel 300, and thus may transmit a data voltage to the data line 171 of the display panel 300.

The gate output pad portion GPAa is disposed at the right side of the first data output pad portion DPA1*a*, and includes a plurality of gate output pads GPa. The gate output pads GP1*a* to GPna of the gate output pad portion GPAa are connected with the plurality of pads of the input pad portion IPA through the wires WR.

The plurality of gate output pads GPa are disposed in a row in which the first data output pads DP1*a* are disposed. The gate output pads GPa are disposed in an area corresponding to the gate pads GP of the display panel 300 in FIG. 2. Thus, the gate output pad GPa disposed at the rear side of the flexible printed circuit board 500 contacts the gate pad GP of the display panel 300, and thus may transmit a clock signal to the clock signal lines CK1 to CKn of the display panel 300. In FIG. 2, when the gate pad GP1 disposed at the rightmost side of the gate pads GP in the display panel 300 to the gate pad GPn disposed at the leftmost side of the gate pads GP in the display panel 300 sequentially receive the first clock signal to the n-th clock signal, in FIG. 3, the gate output pad GP1*a* disposed at the leftmost side of the gate output pad portion GPAa in the flexible printed circuit board 500 to the gate output pad GPna disposed at the rightmost side of the gate output pad portion GPAa in the flexible printed circuit board 500 sequentially receive the first clock signal to the n-th clock signal.

In FIG. 2 and FIG. 3, a pad portion area disposed at the top left end of the display panel 300 and the flexible printed circuit board 500 disposed at the leftmost side of FIG. 1 are mainly described. The contents described with reference to FIG. 2 and FIG. 3 may be equally applied to a pad portion area disposed at the top right end of the display panel 300 and a flexible printed circuit board 500 disposed at the rightmost side of FIG. 1. In this case, configurations of the pad portion area at the top right end of the display panel 100 and the flexible printed circuit board 500 at the rightmost side may be symmetrical to those of the pad portion and the flexible printed circuit board 500 in FIG. 2 and FIG. 3.

Hereinafter, another exemplary embodiment of the present inventive concept will be described with reference to FIG. 4 and FIG. 5.

Figure 4:
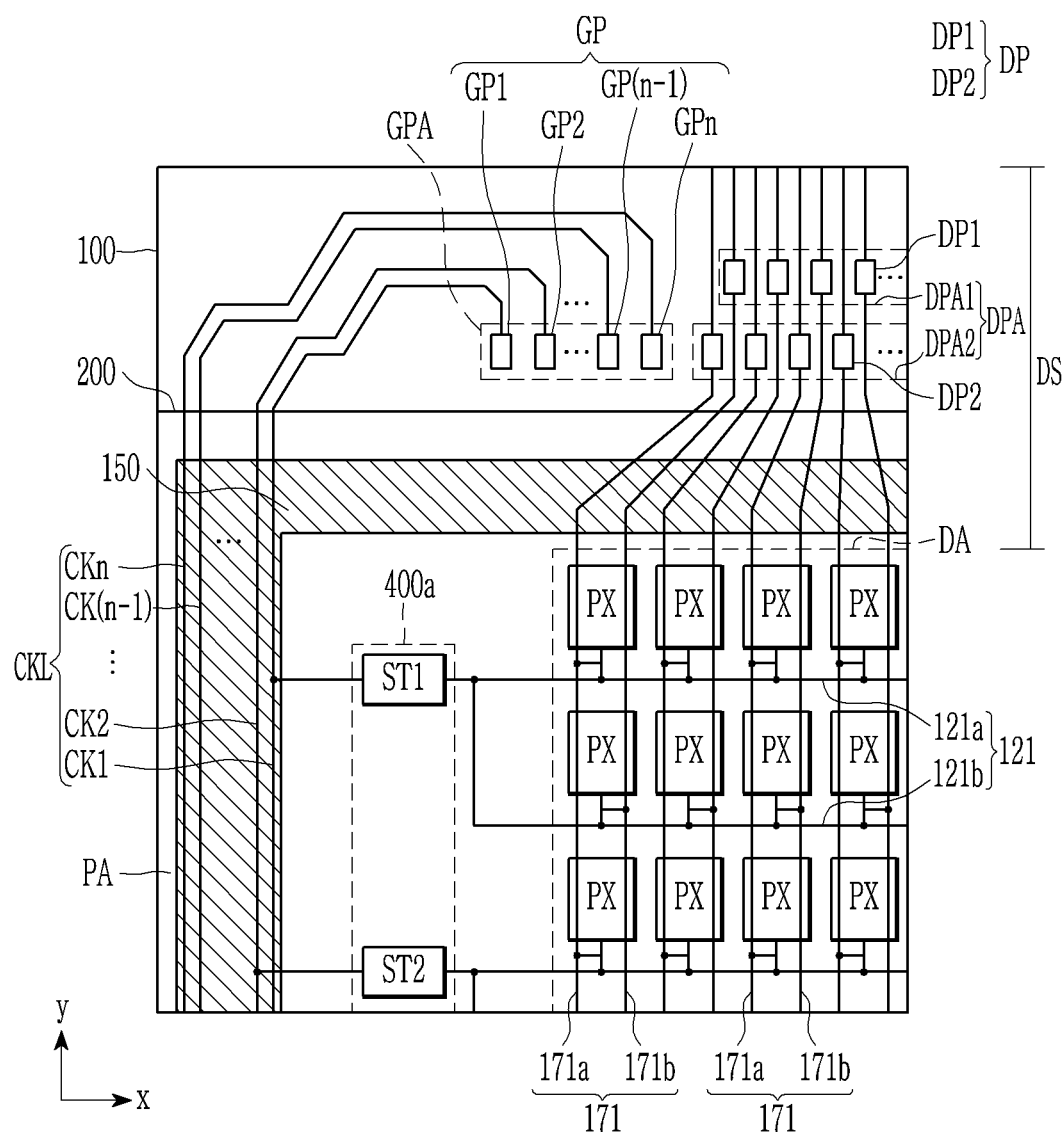
FIG. 4 is an enlarged layout view of the part A of FIG. 1 in a display device according to another exemplary embodiment of the present inventive concept.

FIG. 4 is an enlarged layout view of the part A of FIG. 1 in a display device according to another exemplary embodiment of the present inventive concept. Since the display device of FIG. 4 is the same as the display device of FIG. 2, except for a gate pad portion GPA and a clock signal ling group CKL, no further detailed description thereof will be repeated.

Unlike the display device shown in FIG. 2, in FIG. 4, a plurality of gate pads GP are disposed in a row in which second data pads DP2 are disposed and the plurality of gate pads GP are not disposed in a row in which first data pads DP1 are disposed.

A clock signal line group CKL connected to the gate pad GP extends in a second direction (y-axis direction) above the gate pad GP toward an edge of the display substrate 100 and at a neighboring area of the first data pads DP1 in a plan view. Next, the clock signal line group CKL is bent to the outside of the display panel 300 and then extends in a first direction (x-axis direction), and extends in the second direction (y-axis direction) at the left side of a first gate driver 400a. A portion of the clock signal line group CKL extending in the first direction (x-axis direction) may not overlap a sealant 150, and a portion of the clock signal line group CKL extended in the second direction (y-axis direction) at the left side of the first gate driver 400a may overlap the sealant 150. That is, the clock signal line group CKL includes a first portion that extends in the second direction (y-axis direction) at the outside of the first gate driver 400a and a second portion connected to the first portion from the gate pad GP, and the first portion of the clock signal line group CKL may overlap the sealant 150 and the second portion of the clock signal line group CKL may not overlap the sealant 150.

In case of a display device according to the present exemplary embodiment, a gate pad GP1 disposed at the leftmost side of the gate pads GP to a gate pad GPn disposed at the rightmost side of the gate pads GP may sequentially receive a first clock signal to an n-th clock signal and transmit the received clock signals to clock signal lines CK1 to CKn.

When the gate pad GP is disposed in a row in which the second data pads DP2 are disposed and is not disposed in a row in which the first data pads DP1 are disposed, a space where the clock signal line group CKL can be located can be secured at a neighboring area of the first data pads DP1. Thus, compared to a case that the gate pads GP are disposed at the left side of the first data pads and the second data pads DP1 and DP2, a dead space DS may be reduced.

In addition, since a portion of the clock signal line group CKL extending in the first direction (x-axis direction) does not overlap the sealant 150, a slit may not need to be formed in the clock signal lines CK1 to CKn so that resistance in wiring can be reduced, thereby enabling fast signal transmission and preventing heat generation, thereby improving durability and efficiency of the display device.

Figure 5:
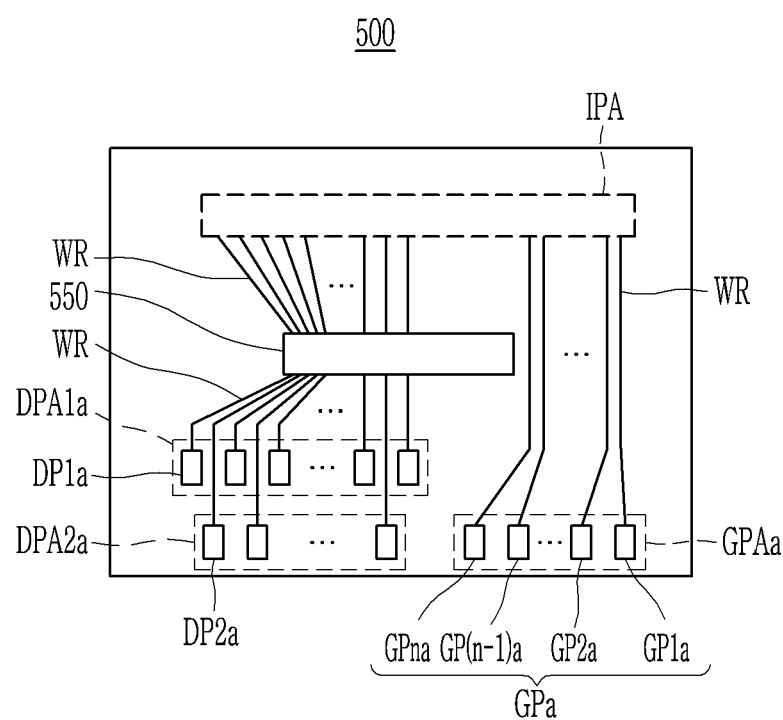
FIG. 5 is a rear side view of a flexible printed circuit board included in the display device according to the present exemplary embodiment.

FIG. 5 is a rear side view of a flexible printed circuit board included in the display device according to the present exemplary embodiment. A flexible printed circuit board 500 shown in FIG. 5 corresponds to the leftmost side flexible printed circuit board 500 in FIG. 1. Except for a gate output pad portion GPAa, the flexible printed circuit board 500 of FIG. 5 is similar to the flexible printed circuit board 500 shown in FIG. 3, and therefore a detailed description of the duplicated contents will be omitted.

The gate output pad portion GPAa is disposed at the right side of a second data output pad portion DPA2a, and includes a plurality of gate output pads GPa. Gate output pads GP1a to GPna of the gate output pad portion GPAa are connected with a plurality of pads of an input pad portion IPA through a plurality of wires WR.

The plurality of gate output pads GPa are disposed in a same row with second data output pads DP2a. The gate output pad GPa is disposed in an area that corresponds to the gate pad GP of the display panel 300 of FIG. 4. Thus, the gate output pads GPa disposed at a rear side of the flexible printed circuit board 500 contact the gate pads GP of the display panel 300 and thus may transmit a clock signal to clock signal lines CK1 to CKn of the display panel 300. In FIG. 3, when the gate pad GP1 disposed in the leftmost side of the gate pads GP in the display panel 300 to the gate pad GPn disposed at the rightmost side of the gate pads GP sequentially receive the first clock signal to the n-th clock signal, in FIG. 5, the gate output pad GP1a disposed at the rightmost side of the gate output pad portion GPAa in the flexible printed circuit board 500 to the gate output pad GPna disposed at the leftmost side of the gate output pad portion GPAa sequentially receive the first clock signal to the n-th clock signal.

Figure 6:
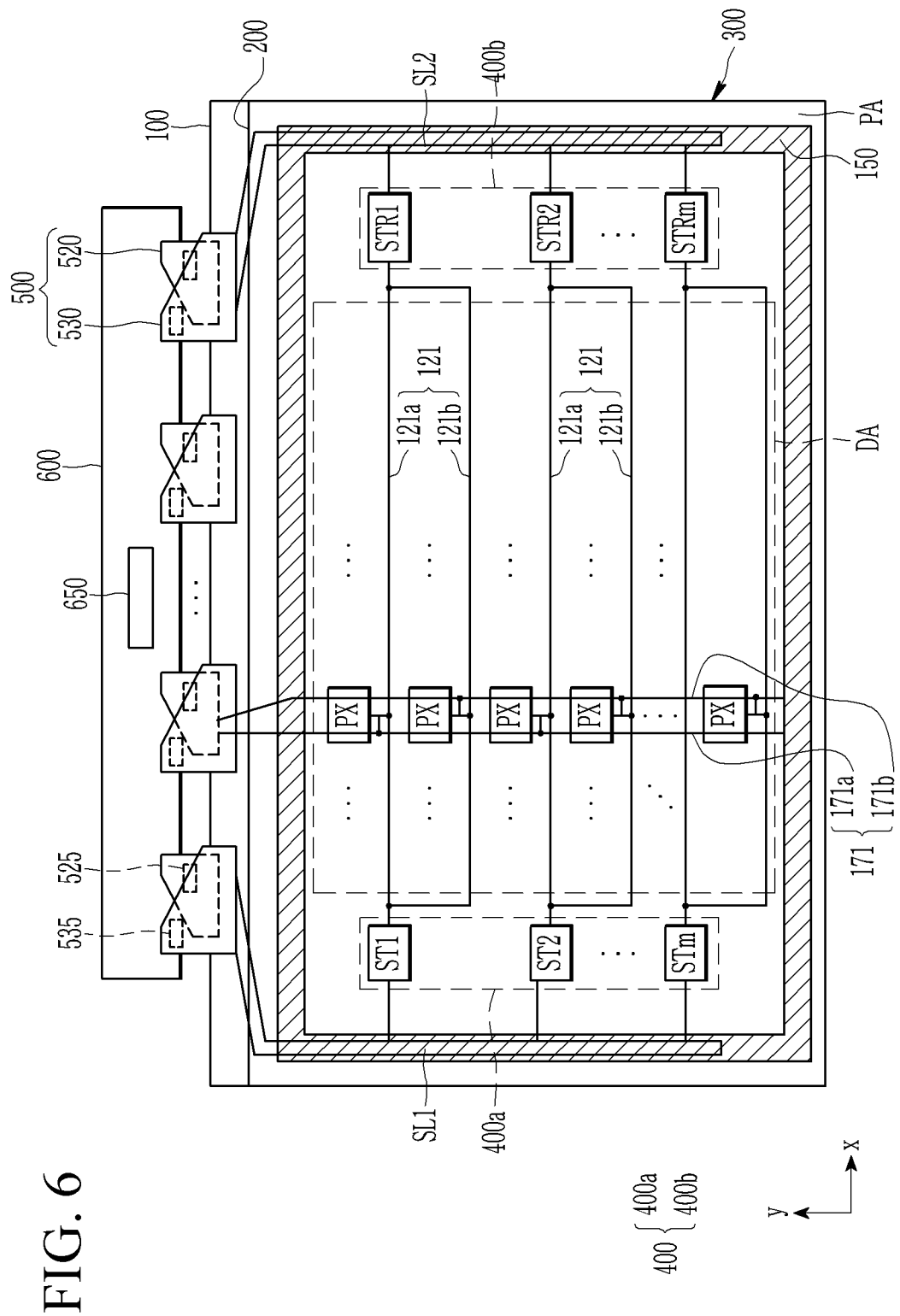
FIG. 6 is a schematic block diagram of a display device according to another exemplary embodiment of the present inventive concept.
Figure 7:
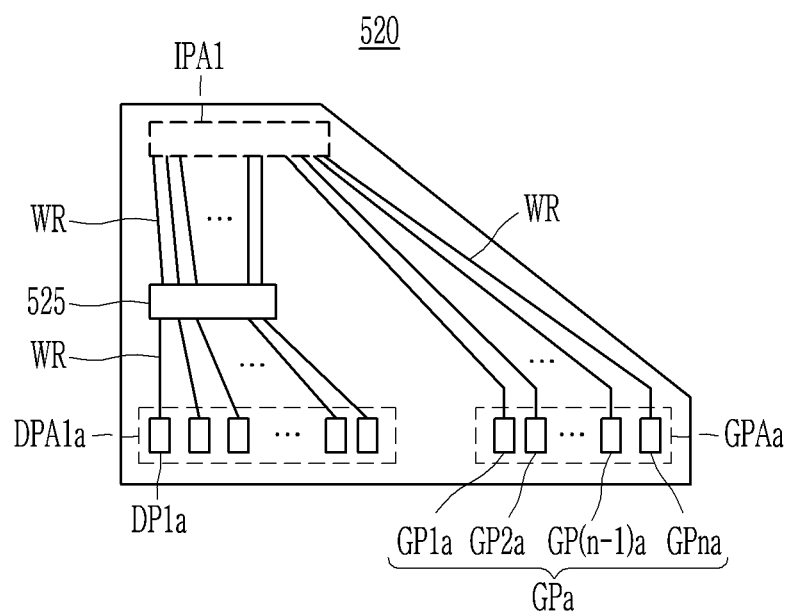
FIG. 7 is a rear side view of the first flexible printed circuit board included in the display device according to the present exemplary embodiment.
Figure 8:
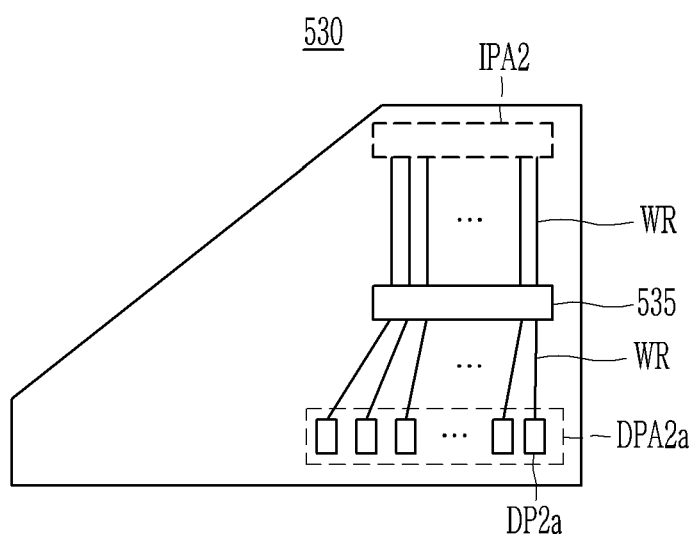
FIG. 8 is a rear side view of the second flexible printed circuit board included in the display device according to the present exemplary embodiment.

Referring to FIG. 6 to FIG. 8, a display device according to anther exemplary embodiment of the present inventive concept will be described.

FIG. 6 is a schematic block diagram of a display device according to another exemplary embodiment of the present inventive concept. The display device FIG. 6 is similar to the display device of FIG. 1, except for flexible printed circuit boards 500, and therefore a detailed description of the duplicated contents will be omitted.

Unlike the display device of FIG. 1, in FIG. 6, each of the flexible printed circuit boards 500 includes a first flexible printed circuit board 520 and a second flexible printed circuit board 530. The first flexible printed circuit board 520 and the second flexible printed circuit board 530 are electrically connected with a printed circuit board 600 and a display panel 300. The first flexible printed circuit board 520 and the second flexible printed circuit board 530 may overlap each other. In addition, the first flexible printed circuit board 520 and the second flexible printed circuit board 530 respectively include a first data driver IC 525 and a second data driver IC 535.

FIG. 7 is a rear side view of the first flexible printed circuit board included in the display device according to the present exemplary embodiment. The first flexible printed circuit board 520 of FIG. 7 corresponds to the first flexible printed circuit board 520 that is disposed at the leftmost side in FIG. 6. The display panel 300 of the display device according to the present exemplary embodiment is the same as the display panel 300 of FIG. 2.

Referring to FIG. 7, the first flexible printed circuit board 520 may be formed in the shape of a pentagon of which one side is an oblique line. However, this is an example, and the first flexible printed circuit board 520 may have any shape.

The first flexible printed circuit board 520 includes a first input pad portion IPA1, a first data driver IC 525, a first data output pad portion DPA1a, and a gate output pad portion GPAa.

The first flexible printed circuit board 520 receives a signal from the printed circuit board 600 through the first input pad portion IPA1 that contacts the printed circuit board 600 at one side thereof. A plurality of pads disposed in the first input pad portion IPA1 may be electrically connected with a plurality of pads that are disposed in the printed circuit board 600 by contacting the plurality of pads.

The first data driver IC 525 may be connected with the pads of the first input pad portions IPA1 by wires WR. The first data driver IC 525 may receive a data control signal and a digital video signal from a signal controller 650 through the wire WR, and may generate a data voltage which is a grayscale voltage corresponding to each digital video signal. The first data driver IC 525 may be connected with the first data output pads DP1a through the wires WR. The data voltage generated by the first data driver IC 525 is applied to the corresponding data line 171 of the display panel 300 through the wire WR.

The first data output pad portion DPA1a is disposed in an area that corresponds to the first data pad portion DPA1 of the display panel 300 of FIG. 2, and the gate output pad portion GPAa is disposed at the right side of the first data output pad portion DPA1a and disposed in an area that corresponds to the gate pad portion GPA of the display panel 300 of FIG. 2.

The first data output pad portion DPA1a includes a plurality of first data output pads DP1a that are arranged in a row disposed along the first direction (x-axis direction). The first data output pads DP1a are disposed in an area that corresponds to the first data pads DP1 of the display panel 300 of FIG. 2. Thus, the first data output pads DP1a disposed at a rear side of the first flexible printed circuit board 520 contact the first data pads DP1 of the display panel 300, and thus may transmit a data voltage to the data line 171 of the display panel 300.

The gate output pad portion GPAa is disposed at the right side of the first data output pad portion DPA1a and includes a plurality of gate output pads GPa. The gate output pads GPa of the gate output pad portion GPAa are connected with the plurality of pads of the first input pad portion IPA1 through the wires WR.

The plurality of gate output pads GPa are arranged in a row in which the first data output pads DP1a is disposed. The gate output pads GPa are disposed in an area that corresponds to the gate pads GP of the display panel 300 of FIG. 2. Thus, the gate output pad GPa disposed at the rear side of the flexible printed circuit board 500 contacts the gate pad GP of the display panel 300, and thus may transmit a clock signal to the clock signal lines CK1 to CKn of the display panel 300. In FIG. 2, the gate pad GP1 disposed at the rightmost side of the display panel 300 to the gate pad GPn disposed at the leftmost side of the display panel 300 sequentially receive the first clock signal to the n-th clock signal, but in FIG. 7, the gate output pad GP1a disposed at the leftmost side of the gate output pad portion GPAa in the flexible printed circuit board 500 to the gate output pad GPna disposed at the rightmost side of the gate output pad portion GPAa in the flexible printed circuit board 500 sequentially receive the first clock signal to the n-th clock signal.

FIG. 8 is a rear side view of the second flexible printed circuit board included in the display device according to the present exemplary embodiment. The second flexible printed circuit board 530 of FIG. 8 corresponds to the second flexible printed circuit board 530 disposed in the leftmost side in FIG. 6.

Referring to FIG. 8, the second flexible printed circuit board 530 may be formed in the shape of a pentagon of which one side is an oblique line, and may be symmetrical to the first flexible printed circuit board 520 in shape. However, this is an example, and the second flexible printed circuit board 530 may have any shape.

The second flexible printed circuit board 530 includes a second input pad portion IPA2, a second data driver IC 535, and a second data output pad portion DPA2a.

The second flexible printed circuit board 530 receives a signal from the printed circuit board 600 through the second input pad portion IPA2 that contacts the printed circuit board 600 at one side thereof. A plurality of pads disposed in the second input pad portion IPA2 may be electrically connected with a plurality of pads that are disposed in the printed circuit board 600 by contacting the plurality of pads.

The second data driver IC 535 may be connected with the pads of the second input pad portion IPA2 by wires WR. The second data driver IC 535 may receive a data control signal and a digital video signal from a signal controller 650 through the wire WR, and may generate a data voltage which is a grayscale voltage corresponding to each digital video signal. The second data driver IC 535 may be connected with second data output pads DP2a through the wires WR. The data voltage generated by the second data driver IC 535 is applied to the corresponding data lines 171 of the display panel 300 through the wire WR.

The second data output pad portion DPA2a is disposed in an area that corresponds to the second data pad portion DPA2 of the display panel 300 of FIG. 2. The second data output pad portion DPA2a includes a plurality of second data output pads DP2a that are arranged in a row disposed along a first direction (x-axis direction). The second data output pads DP2a are disposed in an area that corresponds to the second data pads DP2 of the display panel of FIG. 2. Thus, the second data output pads DP2a disposed at a rear side of the second flexible printed circuit board 530 contact the second data pads DP2 of the display panel 300 and thus may transmit a data voltage to the data line 171 of the display panel 300.

Referring to FIG. 2 and FIG. 6 to FIG. 8, the first flexible printed circuit board 520 is disposed on the display panel 300. The first data output pads DP1a and the gate output pads GPa of the first flexible printed circuit board 520 respectively contact the first data pads DP1 and the gate pads GP of the display panel 300, and the second data pads DP2 of the display panel 300, disposed below the first data pads DP1 in a plan view, are exposed.

The second flexible printed circuit board 530 is disposed on the first flexible printed circuit board 520, while overlapping the first flexible printed circuit board 520. The second data output pads DP2a of the second flexible printed circuit board 530 contact the second data pads DP2 of the display panel 300.

Figure 9:
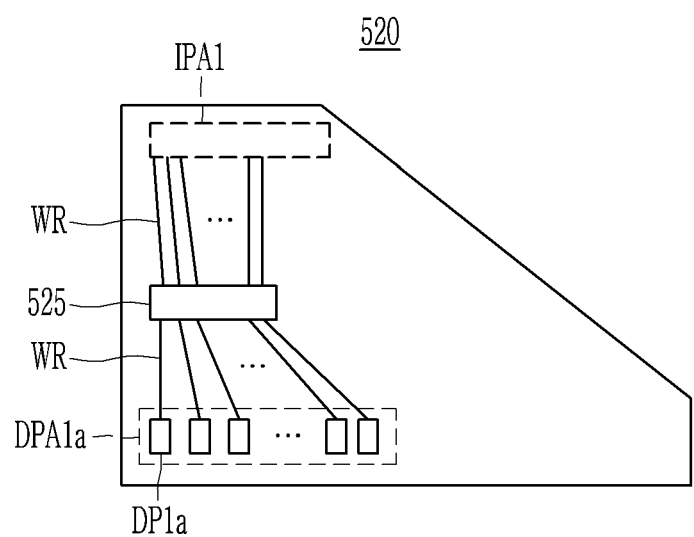
FIG. 9 is a rear side view of a first flexible printed circuit board included in the display device according to the present exemplary embodiment.
Figure 10:
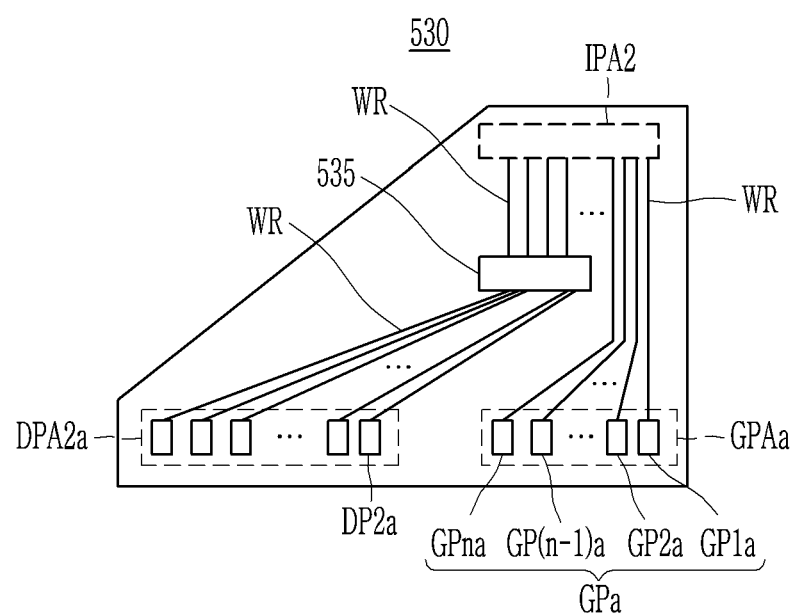
FIG. 10 is a rear side view of a second flexible printed circuit board included in the display device according to the present exemplary embodiment.

Referring to FIG. 9 and FIG. 10, a display device according to another exemplary embodiment of the present inventive concept will be described.

FIG. 9 is a rear side view of a first flexible printed circuit board included in the display device according to the present exemplary embodiment. A first flexible printed circuit board 520 of FIG. 9 corresponds to the first flexible printed circuit board 520 disposed in the leftmost side in FIG. 6. A display panel 300 of the display device according to the present exemplary embodiment is the same as the display panel 300 of FIG. 4.

Referring to FIG. 9, the first flexible printed circuit board 520 includes a first input pad portion IPA1, a first data driving IC 525, and a first data output pad portion DPA1a.

The first flexible printed circuit board 520 receives a signal from the printed circuit board 600 through the first input pad portion IPA1 that contacts the printed circuit board 600 at one side thereof. A plurality of pads disposed in the first input pad portion IPA1 may be electrically connected with a plurality of pads that are disposed in the printed circuit board 600 by contacting the plurality of pads.

The first data driver IC 525 may be connected with the pads of the first input pad portions IPA1 by wires WR, and the first data driver IC 525 may be connected with the first data output pad DP1a through the wires WR. The data voltage generated by the first data driver IC 525 is applied to the corresponding data line 171 of the display panel 300 through the wire WR.

The first data output pad portion DPA1a is disposed in an area that corresponds to the first data pad portion DPA1 of the display panel 300 of FIG. 4. The first data output pad portion DPA1a includes a plurality of first data output pads DP1a that are arranged in a row disposed along a first direction (x-axis direction). The first data output pad DP1a is disposed in an area that corresponds to the first data pad DP1 of the display panel 300 of FIG. 4.

FIG. 10 is a rear side view of a second flexible printed circuit board included in the display device according to the present exemplary embodiment. A second flexible printed circuit board 530 includes a second input pad portion IPA2, a second data driver IC 535, a second data output pad portion DPA2a, and a gate output pad portion GPAa.

The second flexible printed circuit board 530 receives a signal from the printed circuit board 600 through the second input pad portion IPA2 that contacts the printed circuit board 600 at one side thereof. A plurality of pads disposed in the second input pad portion IPA2 may be electrically connected with a plurality of pads that are disposed in the printed circuit board 600 by contacting the plurality of pads.

The second data driver IC 535 may be connected with the pads of the second input pad portion IPA2 by wires WR, and the second data driver IC 535 may be connected with second data output pads DP2a through the wires WR. The data voltage generated by the second data driver IC 535 is applied to the corresponding data lines 171 of the display panel 300 through the wire WR.

The second data output pad portion DPA2a is disposed in an area that corresponds to the second data pad portion DPA2 disposed of the display panel 300 of FIG. 4, and the gate output pad portion GPAa is disposed at the right side of the second data output pad portion DPA2a and disposed in an area that corresponds to the gate pad portion GPA of the display panel 300 of FIG. 4.

The second data output pad portion DPA2a includes a plurality of second data output pads DP2a that are arranged in a row disposed along the first direction (x-axis direction). The second data output pads DP2a are disposed in an area that corresponds to the second data pads DP2 of the display panel 300. Thus, the second data output pads DP2a disposed at the rear side of the second flexible printed circuit board 530 may contact the second data pads DP2 of the display panel 300, and thus transmits a data voltage to the data lines 171 of the display panel 300.

The gate output pad portion GPAa is disposed at the right side of the second data output pad portion DPA2a, and includes a plurality of gate output pads GPa. The gate output pads GPa of the gate output pad portion GPAa are connected with the plurality of pads of the second input pad portion IPA2 through the wires WR.

The plurality of gate output pads GPa are disposed in row in which the second data output pads DP2a are disposed. The gate output pads GPa are disposed in an area that corresponds to the gate pads GP of the display panel 300 of FIG. 4. Thus, the gate output pads GPa disposed at a rear side of the flexible printed circuit board 500 contact the gate pads GP of the display panel 300, and thus may transmit a clock signal to clock signal lines CK1 to CKn of the display panel 300. In FIG. 4, the gate pad GP1 disposed in the leftmost side of the gate pad portion GPA of the display panel 300 to the gate pad GPn disposed at the rightmost side of the gate pad portion GPA in the display panel 300 sequentially receive the first clock signal to the n-th clock signal, but in FIG. 10, the gate output pad GP1a disposed at the rightmost side of the gate output pad portion GPAa in the flexible printed circuit board 500 to the gate output pad GPna disposed at the leftmost side of the gate output pad portion GPAa in the flexible printed circuit board 500 sequentially receive the first clock signal to the n-th clock signal.

Figure 11:
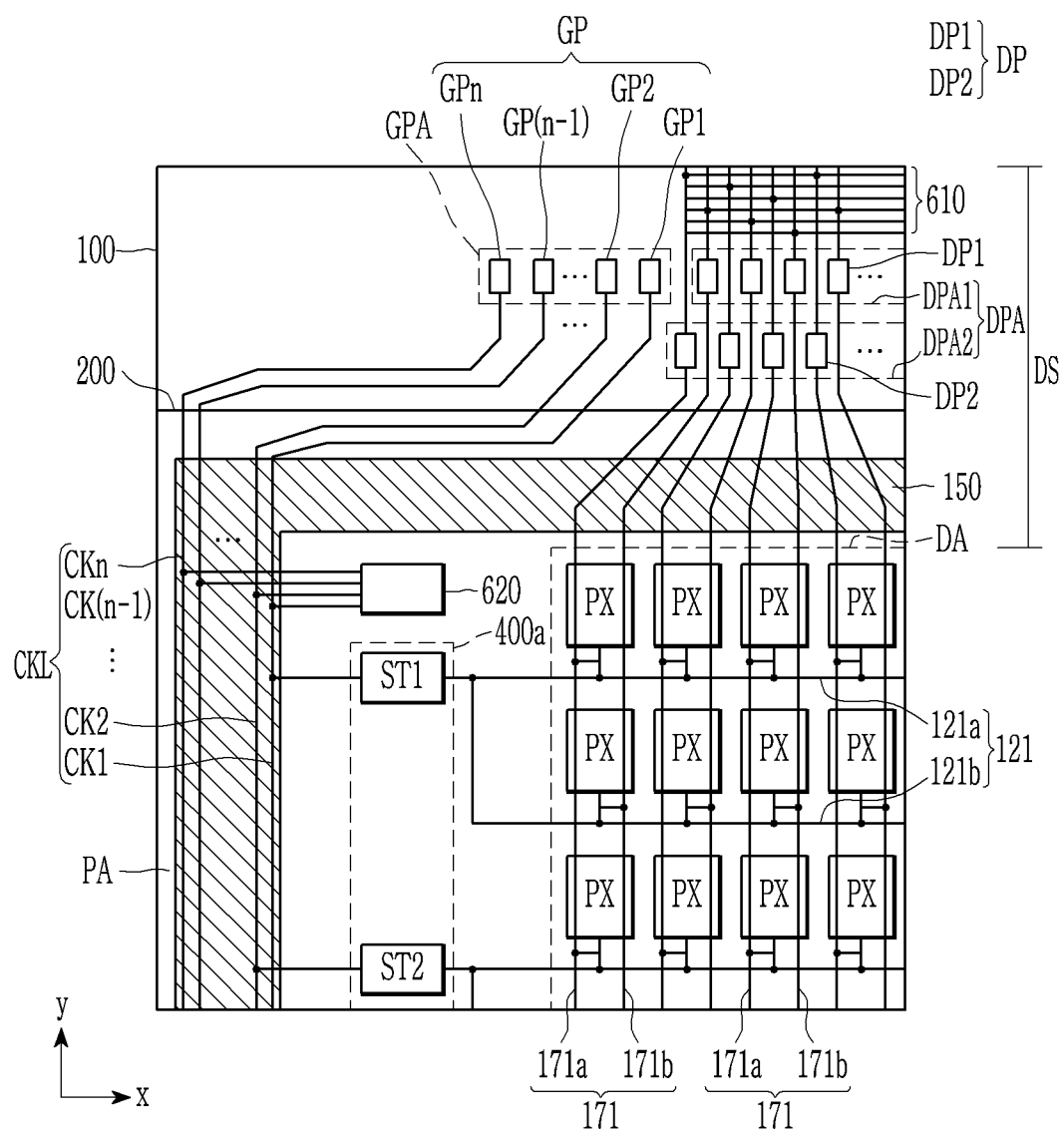
FIG. 11 is an enlarged layout view of the part A of FIG. 1 in a display device according to another exemplary embodiment of the present inventive concept.

FIG. 11 is an enlarged layout view of the part A of FIG. 1 in a display device according to another exemplary embodiment of the present inventive concept. As in FIG. 2, FIG. 11 shows a case that gate pads GP are arranged in a line with first data pads DP1.

Referring to FIG. 11, a display device according to the present exemplary embodiment may further include test wires 610 and an electronic static protection circuit 620.

The test wires 610 may include a plurality of wires extending substantially parallel with each other while extending substantially in a first direction (x-axis direction) at one edge of a first substrate 100. The test wires 610 may be respectively connected with data lines 171 that extend in an upward direction of the first data pads DP1. Each of the test wires 610 is connected with a corresponding data line of the data lines 171 and may transmit a test signal to the corresponding data line of the data lines 171 to test a normal operation of the display device.

The static electricity prevention circuit 620 may be a circuit that includes at least one transistor, and may be disposed above a first gate driver 400a in a plan view in a peripheral area PA. The static electricity prevention circuit 620 is electrically connected with clock signal lines CK1 to CKn, and thus may prevent occurrence of static electricity due to a high voltage applied to the clock signal lines CK1 to CKn.

In case of the display device according to the present exemplary embodiment, the gate pads GP are arranged in a row in which the first data pads DP1 are disposed and are not arranged in a row in which the second data pads DPs are disposed, unlike data pads DP that are arranged in two rows, and thus a space where a clock signal line group CLK can be provided is secured at a side area of the second data pads DP2, thereby causing a dead space DS of the display device to be reduced.

Figure 12:
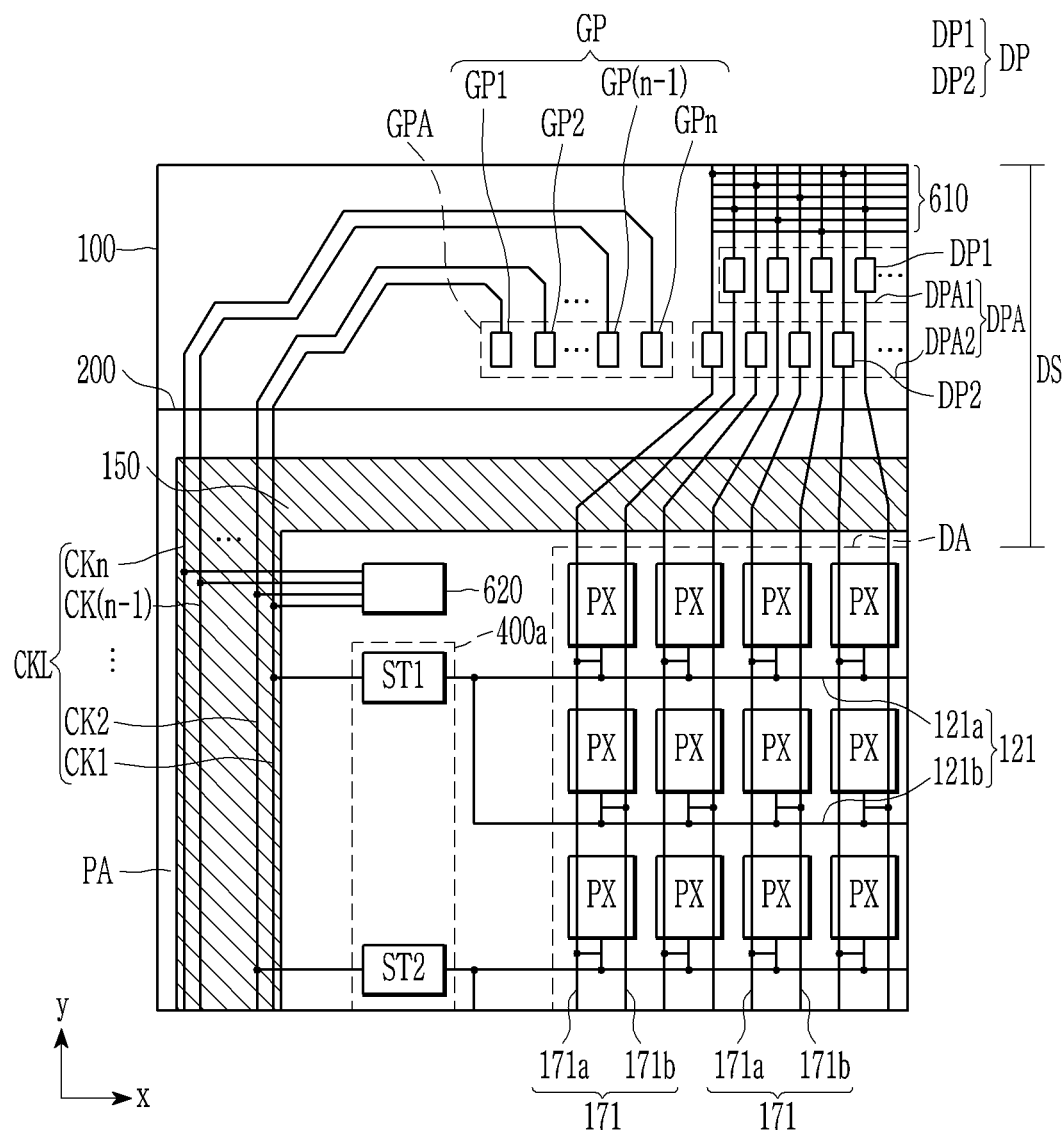
FIG. 12 is an enlarged layout view of the part A of FIG. 1 in a display device according to another exemplary embodiment of the present inventive concept.

FIG. 12 is an enlarged layout view of the part A of FIG. 1 in a display device according to another exemplary embodiment of the present inventive concept. As in FIG. 4, gate pads GP are arranged in a row in which second data pads DP2 are disposed in FIG. 12. Duplicate contents of the above description will be omitted.

Referring to FIG. 12, the display device may further include test wires 610 that are respectively connected with data lines extending in an upward direction of first data pads DP1, and may further include a static electricity prevention circuit 620 that is disposed above a first gate driver 400a and connected with a clock signal line group CKL to prevent of occurrence of static electricity due to a high voltage.

In case of the display according to the present exemplary embodiment, unlike data pads DP that are disposed in two rows, gate pads GP are disposed in a row in which the second data pads DP2 are disposed and are not disposed in a row in which the first data pads DP1 are disposed, and thus a space where a clock signal line group CLK can be provided is secured at a side area of the first data pads DP1, thereby causing a dead space DS of the display device to be reduced.

Figure 13:
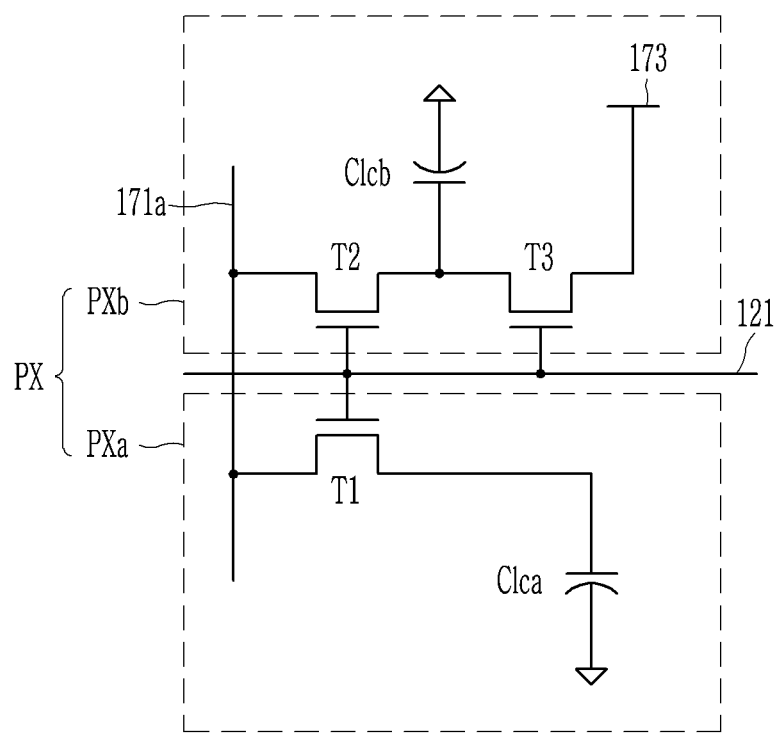
FIG. 13 is an equivalent circuit diagram of a pixel of a display device according to an exemplary embodiment of the present inventive concept.

FIG. 13 is an equivalent circuit diagram of a pixel of a display device according to an exemplary embodiment of the present inventive concept.

Referring to FIG. 13, a pixel PX includes a first subpixel PXa, a second subpixel PXb, a plurality of signal lines 121, 171a, and 173, and a plurality of transistors T1, T2, and T3.

The signal lines 121, 171a, and 173 include a gate line 121 transmitting a gate signal, a first data line 171a transmitting a data voltage, and a storage electrode line 173 to which a constant voltage is applied.

In addition, a first transistor T1 and a second transistor T2 connected to the same gate line 121 and the same first data line 171a are respectively formed in the pixel PX. In addition, a third transistor T3 that is connected to the same gate line 121 as the first and second transistors T1 and T2, and is connected with the second transistor T2 and the storage electrode line 173 is further provided.

A first crystal capacitor Clca connected with the first transistor T1 is formed in the first subpixel PXa, and a second crystal capacitor Clcb connected with the second transistor T2 is formed in the second subpixel PXb.

A first terminal of the first transistor T1 is connected to the gate line 121, a second terminal of the first transistor T1 is connected to the first data line 171a, and a third terminal of the first transistor T1 is connected to the first liquid crystal capacitor Clca.

A first terminal of the second transistor T2 is connected to the gate line 121, a second terminal of the second transistor T2 is connected to the data line 171a, and a third terminal of the second transistor T2 is connected to the second liquid crystal capacitor Clcb.

A first terminal of the third transistor T3 is connected to the gate line 121, a second terminal of the third transistor T3 is connected to the storage electrode line 173, and a third terminal of the third transistor T3 is connected to the third terminal of the second transistor T2.

When a gate-on voltage is applied to the gate line 121, the first to third transistor T1 to T3, which are connected to the gate line 121, are turned on, and the first liquid crystal capacitor Clca and the second liquid crystal capacitor Clcb are charged by a data voltage transmitted through the first data line 171a.

When the third transistor T3 is in the turn-on state, the data voltage transmitted to the second subpixel PXb through the first data line 171a is divided through the third transistor T3 that is connected in series with the second transistor T2. In this case, the voltage division is carried out according to a size of a channel of each of the second transistor T2 and the third transistor T3. Thus, although the same data voltage is transmitted to the first subpixel PXa and the second subpixel PXb through the first data line 171a, the first liquid crystal capacitor Clca and the second liquid crystal capacitor Clcb are charged with different voltages. That is, a voltage charged to the second liquid crystal capacitor Clcb is lower than a voltage charged to the first liquid crystal capacitor Clca. Accordingly, side visibility can be improved by differentiating voltages that are respectively charged to the first and second subpixels PXa and PXb in the same pixel PX.

While this inventive concept has been described in connection with what is presently considered to be practical exemplary embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
a first substrate;
first data pads that are disposed in a first row extending along a first direction on the first substrate;
second data pads that are disposed in a second row extending along the first direction on the first substrate;
gate pads that are disposed in the first row and are not disposed in the second row on the first substrate;
data lines that are connected with the first data pads and the second data pads on the first substrate; and
control signal lines that are connected the gate pads,
wherein the control signal lines extend in a side area of the second data pads from the gate pads.

2. The display device of claim 1, further comprising:
a second substrate;
gate lines extending in the first direction;
a gate driver outputting a gate signal to the gate lines; and
a sealant that bonds the first substrate and the second substrate to each other,
wherein each of the control signal lines comprises a first portion extending in a second direction that crosses the first direction and disposed between the gate driver and an edge of the first substrate extending in the second direction, and a second portion extending in the first direction to connect one of the gate pads and the first portion, and
wherein the second portion of the control signal lines does not overlap with the sealant.

3. The display device of claim 2, wherein the gate driver comprises stages that are arranged in the second direction, and
the stages are connected with the gate lines.

4. The display device of claim 3, further comprising a flexible printed circuit board.

5. The display device of claim 4, wherein the flexible printed circuit board comprises data output pads and gate output pads,
the data output pads comprise first data output pads disposed in a first row extending along the first direction and second output pads disposed in a second row extending along the first direction of the flexible printed circuit board in a plan view, and
the gate output pads are arranged in the first row of the flexible printed circuit board and are not disposed in the second row of the flexible printed circuit board, the gate output pads being connected with the gate pads of the first substrate.

6. The display device of claim 5, wherein the first row of the flexible printed circuit board is disposed closer to an edge of the flexible printed circuit board disposed adjacent to the date output pads than the second row of the flexible printed circuit board.

7. The display device of claim 5, wherein the second row of the flexible printed circuit board is disposed closer to the edge of the flexible printed circuit board disposed adjacent to the date output pads than the first row of the flexible printed circuit board.

8. The display device of claim 4, wherein the flexible printed circuit board comprises a first flexible printed circuit board and a second flexible printed circuit board that overlap each other.

9. The display device of claim 8, wherein the first flexible printed circuit board comprises first data output pads and gate output pads, the second flexible printed circuit board comprises second data output pads, the first data output pads are connected with the first data pads, and the second data output pads are connected with the second data pads.

10. The display device of claim 9, wherein the first data output pads and the gate output pads of the first flexible printed circuit board are arranged in a line, and the gate output pads are connected with the gate pads.

11. The display device of claim 10, wherein the first flexible printed circuit board comprises a first data driving IC, and the second flexible printed circuit board comprises a second data driving IC.

12. The display device of claim 8, wherein the first flexible printed circuit board comprises first data output pads and the second flexible printed circuit board comprises second data output pads and gate output pads, the first data output pads are connected with the first data pads, and the second data output pads are connected with the second data pads.

13. The display device of claim 12, wherein the second data output pads and the gate output pads of the second flexible printed circuit board are disposed in a line, and the gate output pads are connected with the gate pads.

14. The display device of claim 13, further comprising a printed circuit board connected with the first flexible printed circuit board and the second flexible printed circuit board.

15. A display device comprising a display area including a plurality of pixels and a peripheral area surrounding the display area, wherein the peripheral area comprises:

first data pads that are disposed in a first row extending along a first direction, second data pads that are disposed in a second row extending along the first direction, gate pads that are disposed in the first row and are not disposed in the second row, and control signal lines connected with the gate pads, wherein the control signal lines extend in a side area of the second data pads from the gate pads, and wherein the display area comprise:

gate lines extending in the first direction, data lines that are connected with the first data pads and the second data pads and cross the gate lines, and the data lines comprise a first data line and a second data line that simultaneously overlap one of the plurality of pixels.

16. The display device of claim 15, further comprising a gate driver that is disposed in the peripheral area, wherein the gate driver comprises a first gate driver disposed at one side of the display area and a second gate driver disposed at the other side of the display area.

17. The display device of claim 16, wherein the first gate driver comprises a first stage, the second gate driver comprises a second stage, and one of the gate lines connects the first stage and the second stage.

18. The display device of claim 17, wherein each of the gate lines comprises a first sub-gate line and a second sub-gate line, which are connected in the peripheral area and transmit the same gate signal.

19. The display device of claim 18, wherein the control signal lines comprises at least one of a clock signal line, a scan start signal line, and a low voltage line.

20. The display device of claim 19, further comprising a sealant that is disposed in the peripheral area and surrounds the display area.

* * * * *